(12) United States Patent
Miyasaka

(10) Patent No.: US 7,049,527 B1
(45) Date of Patent: May 23, 2006

(54) CONDUCTOR-PATTERN TESTING METHOD, AND ELECTRO-OPTICAL DEVICE

(75) Inventor: Koichi Miyasaka, Suwa (JP)

(73) Assignee: Seiko Epson Corporation (JP)

( * ) Notice: Subject to any disclaimer, the term of this patent is extended or adjusted under 35 U.S.C. 154(b) by 129 days.

(21) Appl. No.: 09/664,643

(22) Filed: Sep. 19, 2000

(30) Foreign Application Priority Data

Sep. 20, 1999 (JP) ................................ 11-266002

(51) Int. Cl.
*H01R 12/04* (2006.01)
*H05K 1/11* (2006.01)

(52) U.S. Cl. .................... 174/261; 361/767; 361/777

(58) Field of Classification Search ............. 174/260, 174/261; 361/767–771, 777, 808; 324/754–762
See application file for complete search history.

(56) References Cited

U.S. PATENT DOCUMENTS 5,406,398 A * 4/1995 Suzuki et al. ................. 359/80
6,165,692 A * 12/2000 Kanai et al. ................. 430/311

FOREIGN PATENT DOCUMENTS

JP          08-211398         8/1996

OTHER PUBLICATIONS

Communication from Japanese Patent Office regarding counterpart application.

* cited by examiner

*Primary Examiner*—Kamand Cuneo
*Assistant Examiner*—Jeremy Norris
(74) *Attorney, Agent, or Firm*—Harness, Dickey & Pierce, P.L.C.

(57) ABSTRACT

A conductor pattern having both elongated conductors and a dummy pattern is formed on a substrate. The dummy pattern is formed of dummy conductors. The elongated conductors are typically transparent electrodes. The dummy pattern is so configured that each of the dummy conductors are mutually set apart with a spacing as appropriate in the extending direction (top-and-bottom direction) and in the array direction (right-and-left direction) of the transparent electrodes to prevent any two inspection probes from contacting a single dummy conductor.

11 Claims, 5 Drawing Sheets

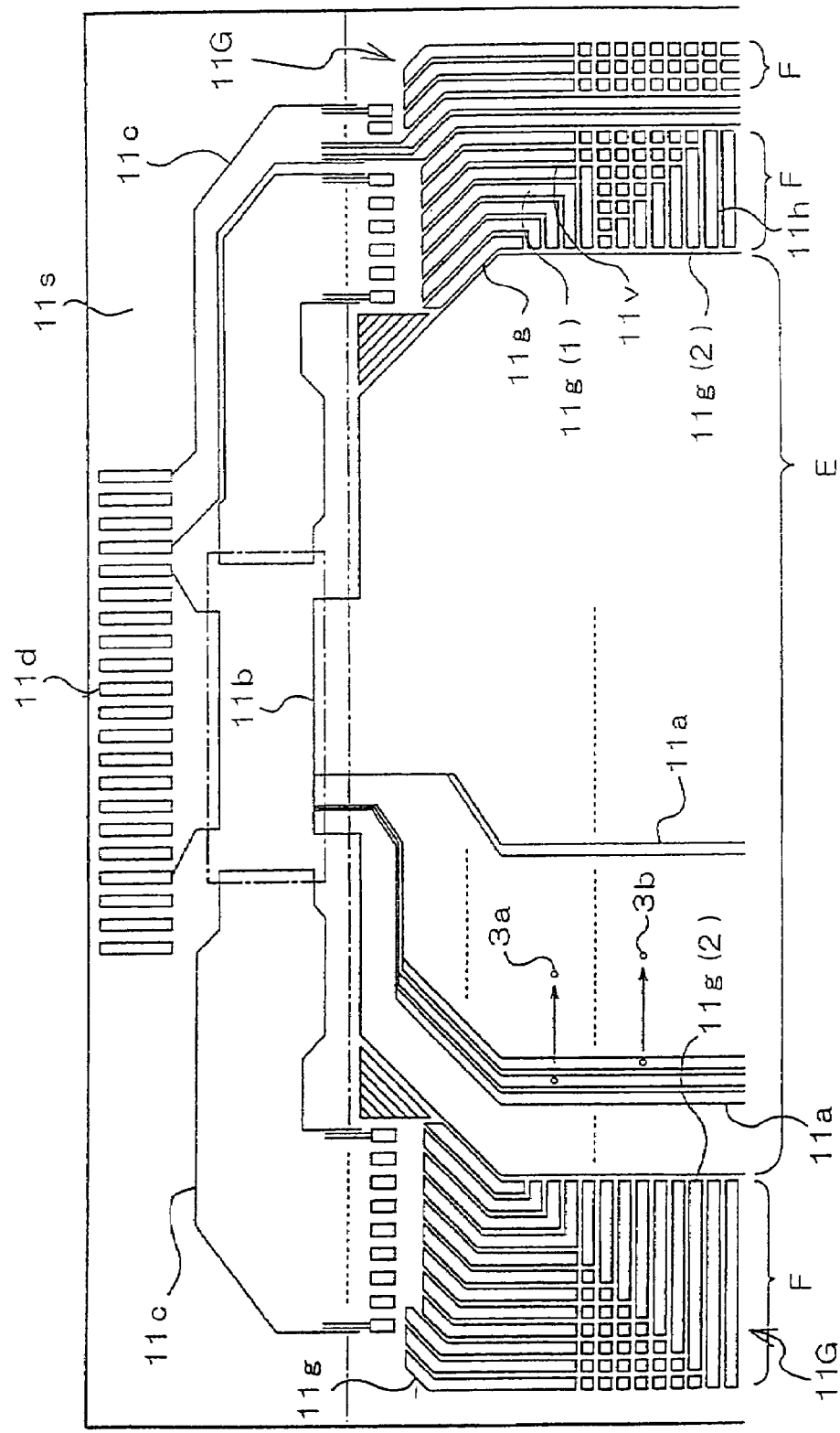
[FIG. 1]

[FIG. 2]
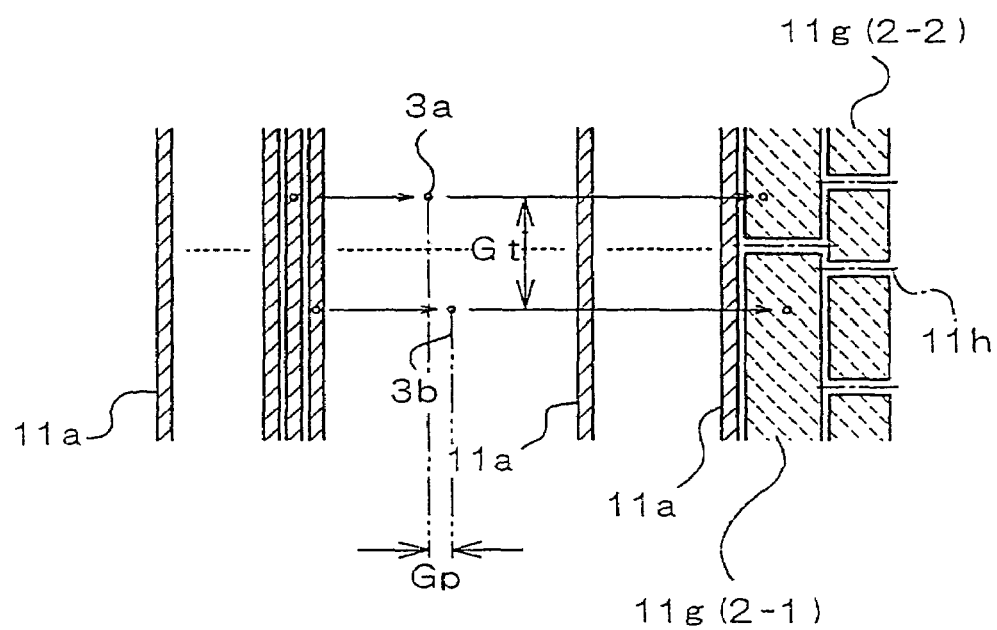
[FIG. 3]
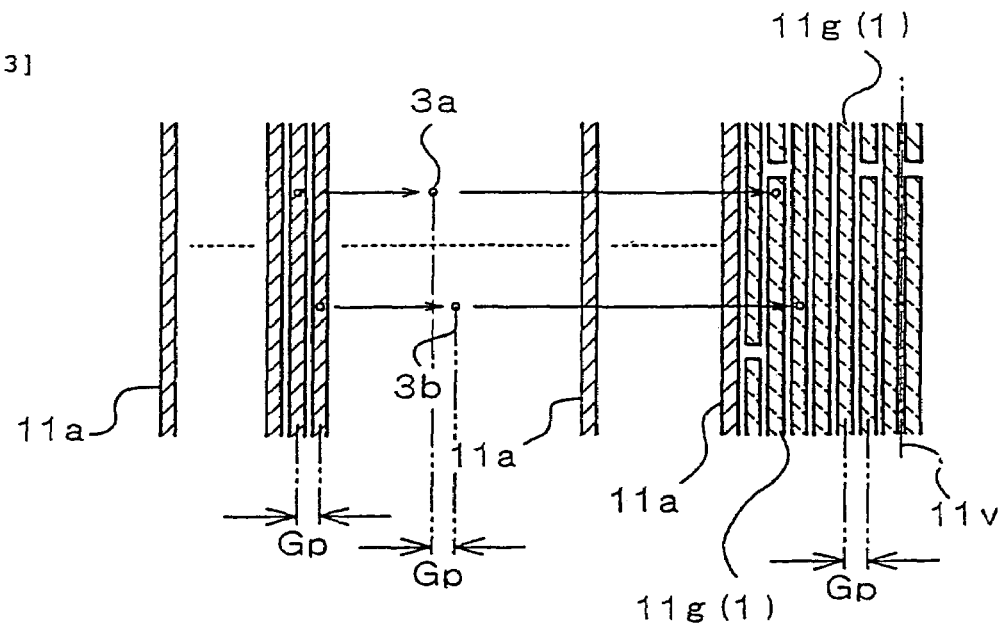

[FIG. 4]
"Prior Art"
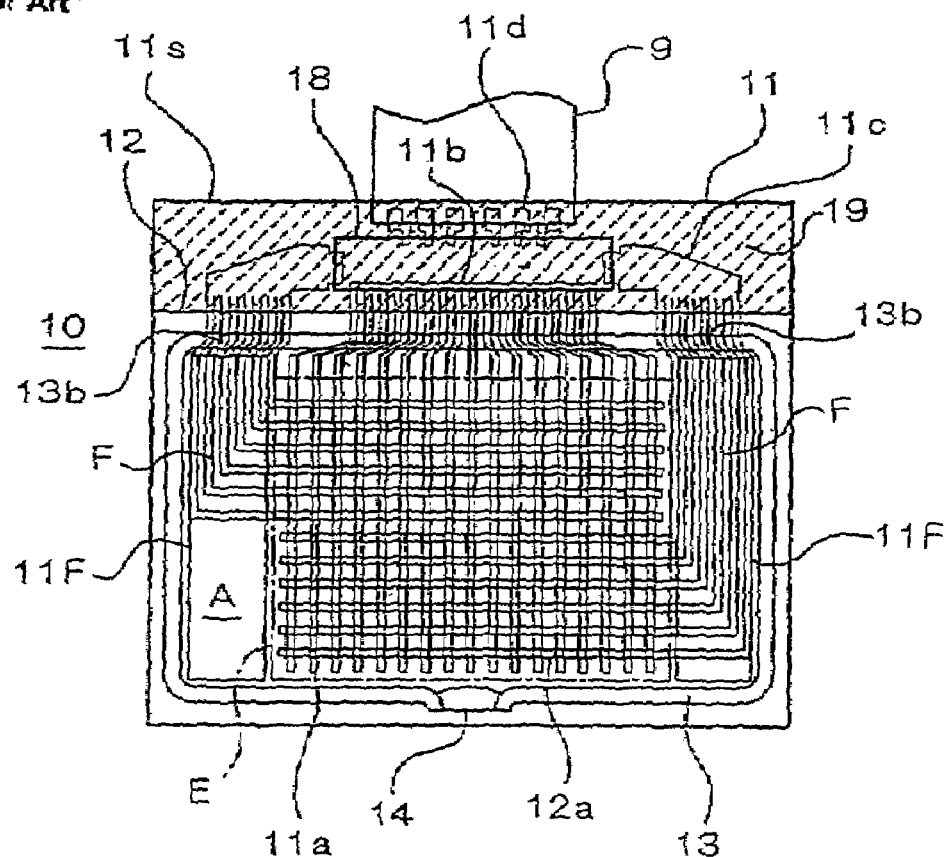
[FIG. 5]
"Prior Art"
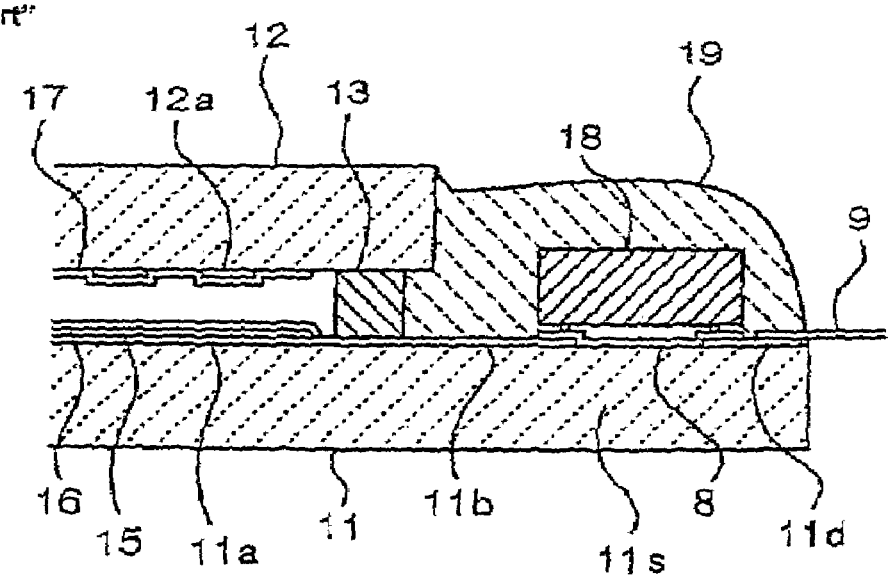

[FIG. 6]
"Prior Art"
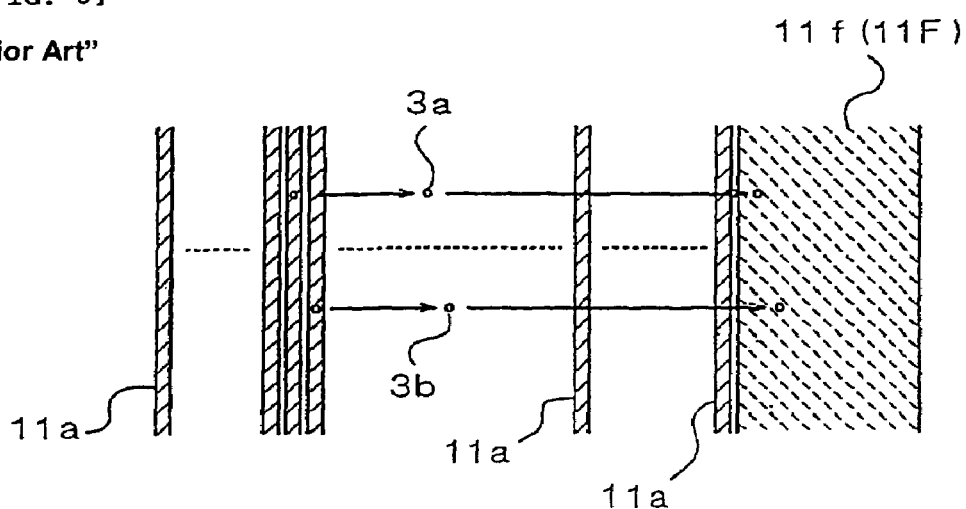
[FIG. 7]
"Prior Art"
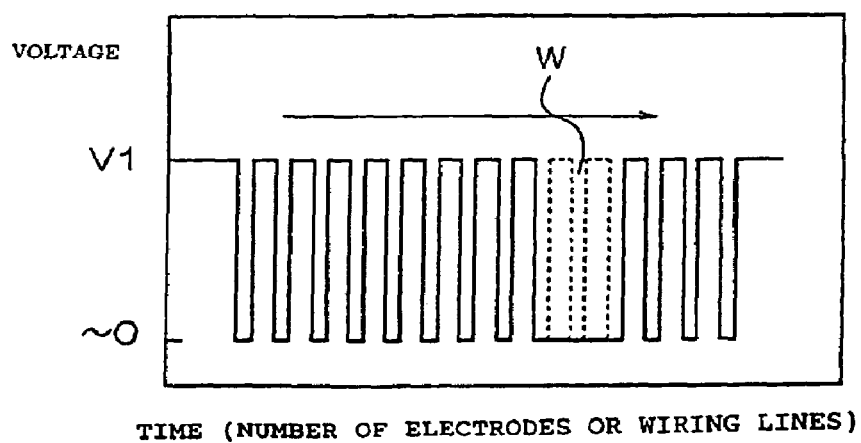

[FIG. 8]
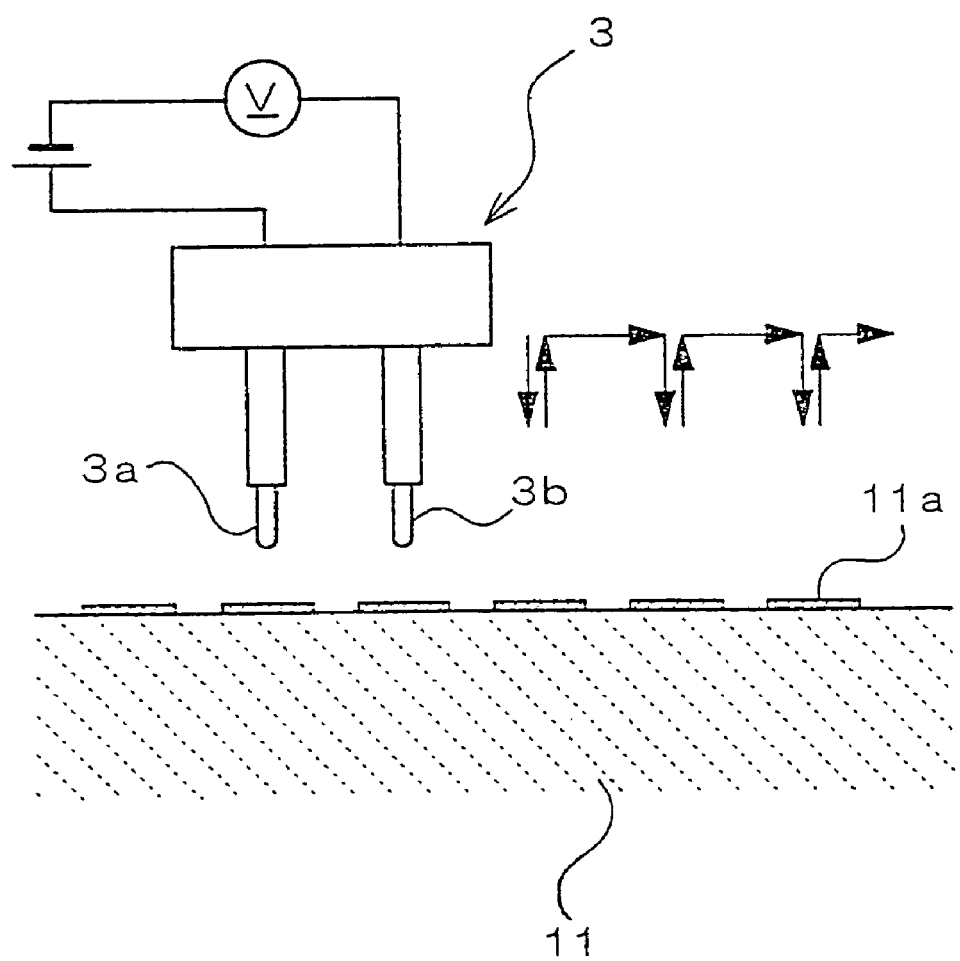

CONDUCTOR-PATTERN TESTING METHOD, AND ELECTRO-OPTICAL DEVICE

BACKGROUND

1. Technical Field of the Invention

The present invention relates to a method of inspecting a conductor pattern as well as to electro-optical devices, and more specifically to a pattern structure which can be suitably implemented as an electrode pattern or a wiring pattern formed on a substrate constituting a liquid crystal panel and to a method of inspecting such a pattern.

2. Description of the Related Art

A typical liquid crystal device is formed by a pair of transparent substrates attached together via a sealant, with liquid crystals filled in the space between the two substrates and surrounded by the sealant, i.e., a liquid crystal sealed area.

An example of liquid crystal device construction is shown in FIG. 4 and FIG. 5. FIG. 4 is a perspective plan view which schematically illustrates the planar structure of a liquid crystal device 10, while FIG. 5 is an expanded sectional view schematically showing the structure of the liquid crystal device 10 in the vicinity of an extended area 11s. The liquid crystal device 10 is defined by a pair of transparent substrates 11 and 12 attached together via a sealant 13, wherein the transparent substrate 11 is made somewhat wider than the transparent substrate 12 so as to have an extended area 11s projecting horizontally beyond one end of the transparent substrate 12. The rectangular interior of the sealant 13 constitutes a liquid crystal sealed area A.

Inside the liquid crystal sealed area A, transparent electrodes 11a are formed on the transparent substrate 11. The transparent electrodes 11a passes beneath the sealant 13 and is pulled onto the surface of the extended area 11s to form wiring lines 11b. Within the scope of the liquid crystal sealed area A, an overcoat film 15 is formed over the transparent electrodes 11a, and an alignment film 16 is further formed over the overcoat film 15. Meanwhile, transparent electrodes 12a are formed on the transparent substrate 12. The transparent electrodes 12a extend in the direction orthogonal to the transparent electrodes 11a, and then leads up to where the sealant 13 is formed. On the transparent electrodes 12a, an alignment film 17 is formed. In between the alignment films 16 and 17, liquid crystals (not shown) are filled, which will be aligned in accordance with the surface conditions of the alignment films 16 and 17.

On the extended area 11s, wiring lines 11c are formed on both sides of the wiring lines 11b in a particular pattern. The wiring lines 11c extends on the transparent substrate 11 up to where the sealant 13 is formed. The sealant 13 is made of resin materials containing conductive particles, and exhibits anisotropic conductivity, i.e., is made electrically conductive only in the depth direction (gap direction) of the substrates, by being pressurized between the transparent substrate 11 and the transparent substrate 12. The transparent electrodes 12a and the wiring lines 11c vertically overlap at a vertically-conductive crossover 13b of the sealant 13, and thus are electrically connected via the vertically-conductive crossover 13b.

The wiring lines 11b and 11c are electrically connected via an anisotropic conductive film 8 to the output terminals (not shown) of the driver IC 18 for driving the liquid crystal device 10. On the extended area 11s, a terminal pattern 11d is also formed. One end of the terminal pattern 11d is electrically connected to the input terminals of the driver IC 18 via an anisotropic conductive film 8, while the other end of the terminal pattern 11d is electrically connected to wiring members 9 of a flexible wiring board, a tape automated bonding (TAB) substrate, etc.

The wiring lines 11b and 11c on the extended area 11s are formed with a small line width and in a fine pitch, and hence are vulnerable to dust and acids and also involves the danger of galvanic corrosion. Thus, after mounting the driver IC 18 and the wiring members 9, the overall mounting plane of the extended area 11s is covered with resin mold 19 containing silicone resin or the like.

In the liquid crystal sealed area A, the transparent electrodes 11a and the transparent electrodes 12a are arranged in a matrix to form a display driving area E. The display driving area E allows to display particular images in accordance with the potentials supplied to each of the transparent electrodes 11a and transparent electrodes 12a. The liquid crystal sealed area A also includes a non-driving area F (non-active area) surrounding the display driving area E (active area). In the non-driving area F, dummy conductors 11f are formed to constitute a dummy pattern 11F. FIG. 6 is an expanded plan view showing a part of the display driving area E and the non-driving area F. The non-driving area F essentially need not be provided with electrodes for driving the liquid crystal device. In the absence of the electrodes, however, the non-driving area F would have a thicker liquid crystal sealed area than that of the display driving area E, and the orientation of the liquid crystals would be altered, resulting in a different appearance from that of the display driving area E. Accordingly, as mentioned above, a dummy pattern 11F is formed which are provided with a plurality of dummy conductors 11f, such as dummy electrodes and dummy wiring lines, having no external connections. The dummy conductors 11f are formed at the same time and with the same material as the transparent electrodes 11a, the wiring lines 11b and the wiring lines 11c.

During the manufacturing process of a liquid crystal device as described above, after the transparent electrodes 11a, wiring lines 11b and 11c are formed on the transparent substrate 11, a pattern inspection may be performed to ensure that no short circuit occurs between any of the electrodes or wiring lines. In a typical pattern inspection, as shown in FIG. 6, a pair of probes 3a and 3b are simultaneously made to contact respectively on one of two mutually-adjacent transparent electrodes 11a to check whether there occurs a short circuit between the two transparent electrodes 11a. The inspection is performed for each set of two adjacent transparent electrodes 11a by progressively moving the probes 3a and 3b to the next respective transparent electrodes 11a one by one in the array direction of the transparent electrodes (right-and-left direction as viewed in FIG. 6). If a short circuit is observed between any of the transparent electrodes 11a, either the short-circuited part is repaired, or the transparent substrate 11 is abandoned as defective.

In the inspection process, the relative position of the pair of probes 3a and 3b is so prescribed that the probes 3a and 3b are spaced in the array direction of the transparent electrodes 11a (left-and-right direction as viewed in FIG. 6) by an amount equivalent to the pattern pitch of the transparent electrodes 11a in order to ensure that each of the probes 3a and 3b will contact respectively on one of two adjacent transparent electrodes 11a. Further, the probes 3a and 3b are so arranged to have a relative deviation in the extending direction of the transparent electrodes 11a (top-and-bottom direction as viewed in FIG. 6) in order to ensure a sufficient interval between the probes 3a and 3b, which serves to prevent short-circuiting between the probes 3a and 3b per se and to facilitate fixing of the probes.

In a conventional inspection process as described above which progressively inspects each set of two adjacent transparent electrodes 11a, a tester 3 having the probes 3a and 3b, as shown in FIG. 8, while maintaining a fixed interval between the probes 3a and 3b, performs progressive scanning in the array direction of the transparent electrodes 11a (right-and-left direction as viewed in FIG. 8) by having each of the probes 3a and 3b contact respectively on one of two adjacent transparent electrodes 11a in a repetition by the pitch of the transparent electrodes 11a. The dummy pattern 11F, if formed in the array direction of the transparent electrodes 11a (to the right as viewed in FIG. 8) is typically constituted by dummy conductors 11f which are wider than the transparent electrodes 11a and rather long in shape. This causes the probes 3a and 3b to contact simultaneously on a single dummy conductor 11f to get short-circuited. Thus, a short circuit is detected because of the dummy conductor 11f even if the non-dummy transparent electrodes 11a are non-defective. FIG. 7 is a graph illustrating a progress of a conventional inspection of an electrode pattern or a wiring pattern. On encountering dummy conductors 11f during the inspection process as described above, the probes 3a and 3b get short-circuited. Then the tester 3 detects an abnormal test result as at W in FIG. 7, thereby erroneously determining that there exists a pattern defect. It may be figured out that the non-dummy transparent electrodes 11a are actually non-defective, but only through a laborious work of analyzing test results for each substrate pattern.

Accordingly, in order to overcome the above-described problem, it is an object of the present invention to provide a method as well as a structure which prevents erroneous detection resulting from a dummy pattern in an inspection of a conductor pattern.

SUMMARY OF THE INVENTION

To overcome the foregoing problem, the present invention provides a conductor-pattern testing method for inspecting an electrode substrate having a conductor pattern constituted by a plurality of elongated conductors formed in parallel to each other on a base and further having a dummy pattern constituted by a plurality of dummy conductors formed in an area on the base where the conductor pattern is not formed, the method examining electrical characteristics among the plurality of conductors by establishing the contact of at least two probes having a positional relationship defined so that the two probes are brought into contact with at least two conductors among the plurality of conductors, wherein the plurality of dummy conductors disposed in the array direction of the plurality of conductors to constitute the dummy pattern are formed in segments so as to prevent two or more of the probes from being simultaneously in contact with any one of the plurality of dummy conductors and the at least two probes are progressively moved for inspection in the array direction of the plurality of conductors.

According to the present invention, dummy conductors disposed in the array direction of the plurality of conductors are formed in segments, and two or more among the probes are prevented from being simultaneously in contact with the same dummy conductor. Thus, short-circuiting between probes, caused by the dummy conductors, does not occurs even when the at least two probes are progressively moved for inspection in the array direction of the plurality of conductors. This can prevent false determination, and can detect rapid and easy detection of a defect in the conductor pattern from the determination result.

In the present invention, the conductors are preferably electrodes or wiring lines formed on the base.

The present invention serves to readily detect defects including short-circuiting between the electrodes or wiring lines formed on the base.

In the present invention, it is preferable that the dummy conductors disposed in the array direction of the electrodes to constitute the dummy pattern are mutually set apart between any pair of the probes in the extending direction of the electrodes.

According to the present invention, by forming the dummy conductors so as to be set apart between any pair of probes in the extending direction of the conductors, short circuits between the probes are readily prevented while not making the dummy pattern too complex. When the dummy conductors are separated in the extending direction particularly be spacing lines (pattern gaps) extending in the array direction of the conductors, providing spacing lines in the number corresponding to the number of probe intervals will suffice to prevent short circuiting between the probes. It is to be noted that, in this application, being separated in the direction X indicates being separated so that there shall be no electrical conductivity in the direction X.

In the present invention, each of the dummy conductors disposed in the array direction of the conductors to constitute the dummy pattern is preferably shorter when viewed along the extending direction of the conductors than the minimum length between any pair of the probes in the extending direction of the conductors.

According to the present invention, by forming the dummy conductors so as to be shorter when viewed along the extending direction of the conductors than the minimum length between any pair of the probes in the extending direction of the conductors, short circuits between the probes do not occur even if the testing positions of a plurality of the probes are deviated in the extending direction of the conductors, and thus erroneous detection resulting from the dummy pattern may be prevented more adequately.

In the present invention, the dummy conductors disposed in the array direction of the conductors to constitute the dummy pattern are mutually separated in the array direction of the conductors in a pitch equivalent to the array pitch of the conductors.

According to the present invention, by separating the dummy conductors in the array direction of the conductors in a pitch equivalent to the array pitch of the conductors, each of the probes, intended to contact respectively on distinct one of conductors, will contact respectively on distinct one of dummy conductors, preventing short circuits between the probes. It is further preferable to form the conductors and the dummy conductors so as to be in phase with each other. This ensures that each of the probes will respectively contact on distinct one of dummy conductors without altering the operation cycle of the probes, thereby further ensuring prevention of short circuits between the probes.

Preferably in the present invention, the base is a substrate, and the electrode substrate is an electro-optical device in which a plurality of electrodes and wiring lines are formed in a particular pattern on the surface of the substrate and electro-optical material to be affected by an electric field generated by the electrodes are further disposed thereover.

An electro-optical device according to the present invention includes: a conductor pattern constituted by a plurality of elongated conductors formed in parallel to each other on a base; a dummy pattern, which are not required to work as the conductors, constituted by a plurality of dummy conductors formed in an area on the base where the conductor pattern is not formed; and electro-optical material disposed on the conductor pattern. In the electro-optical device, the dummy conductors disposed in the array direction of the conductors to constitute the dummy pattern are mutually separated in the extending direction of the conductors. Each of the dummy conductors is preferably shorter when viewed along the extending direction of the conductors than the minimum length between any pair of the probes in the extending direction of the conductors. Thus, erroneous detection resulting from the dummy pattern may be prevented by forming each of the dummy conductors to be shorter than a certain length when viewed along the extending direction of the conductors and performing inspections with a probe interval not less than the particular length.

Another electro-optical device according to the present invention includes: a conductor pattern constituted by a plurality of elongated conductors formed in parallel to each other on a base; a dummy pattern, which are not required to work as the conductors, constituted by a plurality of dummy conductors formed in an area on the base where the conductor pattern is not formed; and electro-optical material disposed on the conductor pattern. In the electro-optical device, the dummy conductors disposed in the array direction of the conductors to constitute the dummy pattern are mutually separated in the array direction of the plurality of conductors in a pitch substantially equivalent to the array pitch of the conductors.

In the electro-optical device, it is preferable that the plurality of dummy conductors disposed in the array direction of the conductors to constitute the dummy pattern are mutually separated in the extending direction of the conductors.

BRIEF DESCRIPTION OF THE DRAWINGS

FIG. 1 is an expanded plan view showing a liquid crystal device, which operates the inspection method of a conductor pattern, in the vicinity of an extended area according to the present invention.

FIG. 2 is a schematic diagram illustrating a method of inspecting a conductor pattern as well as a dummy pattern structure according to the present invention.

FIG. 3 is a schematic diagram illustrating a method of inspecting a conductor pattern as well as another dummy pattern structure according to the present invention.

FIG. 4 is a perspective plan view of the overall structure of a liquid crystal device.

FIG. 5 is an expanded sectional view showing the structure of a liquid crystal device in the vicinity of an extended area.

FIG. 6 is a schematic diagram illustrating a method of inspecting an electrode pattern on a substrate constituting a conventional liquid crystal device.

FIG. 7 is a graph schematically showing a test result obtained by a conventional inspection method.

FIG. 8 is a schematic illustration of a conventional inspection method.

DETAILED DESCRIPTION OF THE PREFERRED EMBODIMENTS

A method of inspecting a conductor pattern as well as an electro-optical device according to the present invention will now be described in detail in their preferred embodiments. It is to be noted that, although the embodiments described below are concerned with a method of inspecting an electrode pattern or a wiring pattern formed on a substrate (panel substrate) constituting a liquid crystal device (liquid crystal panel) as well as a construction of such a liquid crystal device, the present invention is applicable to a variety of conductor patterns not only to an electrode pattern or a wiring pattern on a substrate constituting a liquid crystal device, but also to a variety of electro-optical devices including luminescence devices or plasma display devices as well as liquid crystal devices.

FIG. 1 is a fragmentary expanded plan view showing a part of a transparent substrate 11 constituting a liquid crystal device according to a preferred embodiment. The liquid crystal device of this embodiment is constructed as identical to the liquid crystal device 10 shown in FIG. 4 and FIG. 5, except for the pattern structure of transparent conductors formed on the transparent substrate 11. So the description as to the identical construction will be omitted.

Referring to FIG. 1, on the surface of the transparent substrate 11, there are provided: transparent electrodes 11a, wiring lines 11b and 11c, a terminal pattern 11d, formed by depositing, for example, indium tin oxide (ITO) by the sputtering method; and a dummy pattern 11G formed in the non-driving area F outside the display driving area E where the transparent electrodes 11a are formed. On the dummy pattern 11G, there are formed a multiplicity of dummy conductors 11g. As is conventional, these dummy conductors are so arranged as to extend substantially over the entire non-driving area F.

In this embodiment, the dummy pattern 11G is so configured that the dummy conductors 11g are mutually set apart with spacing therebetween as appropriate in the extending direction (top-and-bottom direction as viewed in FIG. 1) and in the array direction (right-and-left direction as viewed in FIG. 1) of the transparent electrodes 11a. In the example illustrated in FIG. 1, a dummy pattern 11G, which substantially extends over the entire non-driving area F, includes on both sides in the array direction of the transparent electrodes 11a (to the right and to the left in FIG. 1): dummy conductors 11g(1) whose width and spacing are so arranged that the transparent electrodes 11a and the dummy conductors 11g(1) are formed in a substantially equivalent pitch in the array direction; and dummy conductors 11g(2), whose pitch in the array direction is different from that of the transparent electrodes 11a, yet each of which are mutually separated so as to be shorter than a prescribed interval between a pair of probes 3a and 3b when viewed along the extending direction of the transparent electrodes 11a. The dummy conductors 11g(1) are separated parallel to each other by gaps 11v (where conductors are not formed) which extend in the extending direction of the transparent electrodes 11a, and thus constitutes a stripe form. The dummy conductors 11g(2), on the other hand, are mutually separated by gaps 11h (where conductors are not formed) extending in the array direction of the transparent electrodes 11a in a pitch shorter than the prescribed interval between the probes 3a and 3b when viewed along the extending direction of the transparent electrodes 11a.

When a test is performed as to whether each set of two mutually-adjacent transparent electrodes 11a suffer a short-circuit problem by moving the probes 3a and 3b to the right as viewed in FIG. 1, the dummy pattern 11G having the dummy conductors 11g(1) and the dummy conductors 11g(2) as described above ensures that the probes 3a and 3b, even when moved from the display driving area E into the non-driving area F, avoid the conventionally-suffered problem of, as shown in FIG. 6, simultaneously contacting on a single dummy conductor 11g, and instead contact respectively on distinct one of two dummy conductors 11g without fail. Thus, no short-circuit between the probes 3a and 3b results from the dummy conductors 11g.

FIG. 2 is a schematic diagram illustrating advantages of a dummy pattern according to this embodiment, in which $G_t$ and $G_p$ indicate the intervals between the probe 3a and the probe 3b respectively in the extending direction and in the array direction of the transparent electrodes 11a. Referring to FIG. 2, the tester 3 moves the probes 3a and 3b from the display driving area E to the non-driving area F in the array direction of the transparent electrodes 11a (to the right in FIG. 2). The dummy conductors 11g(2-1) are mutually set apart by a gap 11h between the probe 3a and the probe 3b at least in the extending direction of the transparent electrodes 11a. Thus, the probe 3a and the probe 3b are not allowed to simultaneously contact on a single dummy conductor 11g, and thereby short circuits resulting from the dummy pattern 11G are eliminated.

The above structure is only workable, however, as long as the gap 11h separating the dummy conductors 11g(2-1) is so placed that the probes 3a and 3b are moved thereover. Accordingly, the structure requires that the scanning position of the tester 3 be set across the gap 11h, thus diminishing the flexibility of the testing position.

The above problem may be avoided, as in the embodiment shown in FIG. 1, by separating the dummy conductors 11g(2-1) by the gaps 11h having a pitch shorter than $G_t$ when viewed along the extending direction of the transparent electrodes 11a, so that the dummy conductors 11g(2—2) are formed. This ensures, regardless of the scanning position of the tester 3 relative to the gaps 11h, that the probe 3a and the probe 3b are always mutually across one of the gaps 11h, thus preventing for sure short circuits resulting from the dummy pattern 11G.

FIG. 3 is another schematic diagram illustrating advantages of this embodiment. Referring to FIG. 3, the dummy conductors 11g(1) and the gaps 11v therebetween constituting the dummy pattern 11G are formed in the same pitch as that of the transparent electrodes 11a when viewed along the array direction of the transparent electrodes 11a. ($G_p$ is set equal to the above pitch.) Thus, the probes 3a and 3b can be continuously moved from the display driving area E to the non-driving area F without causing short circuits resulting from the dummy pattern 11G.

In the above example, particularly by forming the dummy conductors 11g to be in phase with the transparent electrodes 11a along the array direction of the transparent electrodes, erroneous detection can be prevented for sure without altering the operation cycle of the probes 3a and 3b in the course of an inspection.

The dummy pattern 11G shown in FIG. 1 includes both the dummy conductors 11g(1) and the dummy conductors 11g(2). This allows for more flexibility in probe operations while preventing erroneous detection, and more tolerance for different probe intervals.

It is to be understood that an inspection method and an electro-optical device according to the present invention are not restricted by the above-described examples and that various modifications may be made without departing from the gist of the present invention. For example, the structure of conductor pattern and dummy pattern as described above may be implemented as an electrode pattern and a wiring pattern formed on the transparent substrate 12 as well as on the transparent substrate 11. Furthermore, the object to be inspected may be wiring lines instead of the electrodes described above, and the inspection method may be applied to any type of conductive members.

Accordingly, in the present invention, dummy conductors disposed in the array direction of conductors are formed in segments so as to prevent any two or more test probes from contacting on one of the dummy conductors simultaneously, and to prevent short circuits between any of the probes resulting from the dummy pattern when the probes are progressively moved in the array direction of conductors for inspection, thereby avoiding erroneous detection and achieving quick and simple determination from the test results whether the conductor pattern is defective or not.

What is claimed is:

1. An electrooptical device having a conductor pattern constituted by a plurality of elongated conductors formed in parallel to each other on a base, further having a dummy pattern constituted by a plurality of dummy conductors formed in an area on said base where said conductor pattern is not formed, the dummy patterns including a plurality of dummy pattern rows aligned parallel to each other and to the elongated conductors, and in which electrooptical material is disposed on said conductor pattern, wherein said plurality of dummy conductors disposed in an array direction of said plurality of conductors to constitute said dummy pattern are mutually separated by gaps in an extending direction of said plurality of elongated conductors, the gaps in adjacent dummy pattern rows being shifted out of alignment from each other with respect to the extending direction, and wherein said dummy conductors are electrically independent of each other.

2. An electro-optical device comprising', a conductor pattern having a plurality of elongated conductors formed in parallel to each other in a first area on a base; said conductor pattern having a dummy pattern, said dummy pattern being a plurality of dummy conductors formed in at least a second area on said base, said dummy conductors being arranged in rows of dummy conductors, each row being parallel to an adjacent row and to said elongated conductors, said rows being separated by a gap, the gaps in adjacent dummy pattern rows being shifted out of alignment from each other with respect to an extending direction of said elongated conductors', and electro-optical material being disposed on said conductor pattern', wherein each of said plurality of dummy conductors are disposed in an array direction of said plurality of elongated conductors to form said dummy pattern, and each of said plurality of dummy conductors are mutually electrically separated in the array direction of said plurality of elongated conductors, and wherein said dummy conductors are electrically independent of each other.

3. The electro-optical device according to claim 2, wherein at least two of said plurality of dummy conductors disposed in the array direction of said plurality of elongated conductors are each mutually electrically separated in the extending direction of said plurality of elongated conductors.

4. The electro-optical device according to claim 2, wherein each of said plurality of dummy conductors being mutually electrically separated in the array direction of said plurality of elongated conductors have a dummy conductor width and a dummy conductor spacing equivalent to a width and a spacing of each of the elongated conductors.

5. The electro-optical device according to claim 4, wherein said plurality of elongated conductors formed in parallel to each other have a fixed pitch.

6. The electro-optical device according to claim 5, wherein said plurality of dummy conductors being mutually electrically separated in the array direction of said plurality of elongated conductors have a dummy conductor pitch equal to the fixed pitch of the plurality of elongated conductors.

7. The electro-optical device according to claim 2, wherein said plurality of elongated conductors and said plurality of dummy conductors are selected from the group consisting of electrodes and wiring lines formed on said base.

8. An electro-optical device comprising:
   a conductor pattern having an electro-optical material disposed thereon;
   said conductor pattern having a plurality of conductors, said plurality of conductors formed as adjacent pairs of conductors on a first area of a base;
   said conductor pattern having a plurality of dummy conductors, said plurality of dummy conductors formed as adjacent pairs of dummy conductors on at least a second area of said base;
   each of said plurality of conductors and each of said plurality of dummy conductors having a common width;
   each of said adjacent pairs of conductors having a common pitch; said common pitch matching a probe pair spacing; and
   each of said plurality of dummy conductors being disposed in an array direction of said plurality of conductors;
   wherein each of the adjacent pairs of dummy conductors have a dummy conductor pitch matching the probe pair spacing such that the probe pair spacing is retained in the array direction of said plurality of dummy conductors.

9. The electro-optical device according to claim 8, wherein at least two of said dummy conductors have a length in an extending direction of said plurality of conductors.

10. The electro-optical device according to claim 9, wherein the at least two of said plurality of dummy conductors are separated by a gap, said gap perpendicular to the length in the extending direction of said plurality of conductors.

11. The electro-optical device according to claim 10, wherein said gap comprises a gap dimension smaller than a dimension of the probe pair spacing.

* * * * *